United States Patent [19]

van Hoof

[11] Patent Number: 4,708,763
[45] Date of Patent: Nov. 24, 1987

[54] METHOD OF MANUFACTURING BISMUTH GERMANATE CRYSTALS

[75] Inventor: Leonardus A. H. van Hoof, Eindhoven, Netherlands

[73] Assignee: U.S. Philips Corporation, New York, N.Y.

[21] Appl. No.: 940,237

[22] Filed: Dec. 9, 1986

Related U.S. Application Data

[63] Continuation of Ser. No. 759,999, Jul. 29, 1985, abandoned.

[30] Foreign Application Priority Data

Aug. 23, 1984 [NL] Netherlands ............... 8402575

[51] Int. Cl.$^4$ .................. C30B 11/04; C30B 11/08
[52] U.S. Cl. ................... 156/616 R; 156/604; 156/624; 156/DIG. 67; 156/DIG. 79; 423/393; 423/617; 423/618
[58] Field of Search ............ 156/604, 616 R, 624, 156/DIG. 67, DIG. 19; 423/593, 617, 618

[56] References Cited

U.S. PATENT DOCUMENTS 1,793,672  2/1931  Bridgman .............. 156/616 R
2,816,050 12/1957  Hunter ................. 156/616 R
2,835,614  5/1958  Pohl .................... 156/616 R
3,060,065 10/1962  Orem ................... 156/616 R
3,620,686 11/1971  Pfann ................... 156/616 R

OTHER PUBLICATIONS

Speranskaya et al., The Bismuth Oxide–Germanium Dioxide System, Russian Journal of Inorganic Chemistry, vol. 9, No. 2, Feb. 1964, pp. 226–230.
Nitsche, Crystal Growth and Electro-Optic Effect of Bismuth Germanate, Journal of Applied Physics, vol. 36, No. 8, Aug. 1965, pp. 2358–2360.

Primary Examiner—John Doll
Assistant Examiner—Robert M. Kunemund
Attorney, Agent, or Firm—Norman N. Spain

[57] ABSTRACT

The invention relates to a method of manufacturing bismuth germanate ($Bi_4Ge_3O_{12}$) crystals using the Bridgman technique. A high degree of crystal perfection and an acceptable level of inclusions are obtained by changing the stoichiometry of the starting mixture in favor of $Bi_2O_3$, such that the starting mixture contains between 40.2 and 40.5 mol. % of $Bi_2O_3$ and between 59.8 and 59.5 mol. % of $GeO_2$.

1 Claim, 1 Drawing Figure

U.S. Patent  Nov. 24, 1987  4,708,763
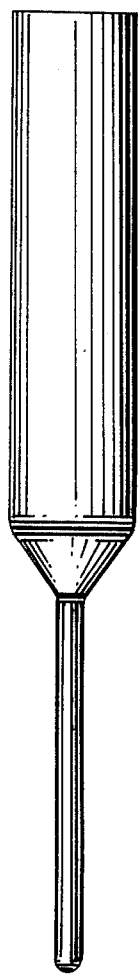

METHOD OF MANUFACTURING BISMUTH GERMANATE CRYSTALS

This is a continuation of application Ser. No. 759,999, filed July 29, 1985, now abandoned.

The invention relates to a method of manufacturing bismuth germanate ($Bi_4Ge_3O_{12}$) crystals and to the crystals thus obtained.

Bismuth germanate crystals of the composition $Bi_4Ge_3O_{12}$, also referred to as BGO, have attracted much attention due to their scintillation properties. The crystals are suitable for various uses, for example, as detectors in a high-resolution electromagnetic calorimeter or as X-ray detectors in tomographic equipment.

Up till now a customary method of manufacturing these crystals has been the Czochralski technique. According to this method a seed crystal is brought into contact with the surface of a melt, and subsequently the seed crystal is pulled up at an accurately controlled rate. This method has the advantage that no additional thermomechanical stresses are introduced because the crystal is not grown and cooled in a crucible. However, a disadvantage with this method is that there is substantial circulation of the melt and this causes impurities to be introduced into the melt, as described by E. Lorenz: "Status of BGO development and perspectives in high energy physics" in Nuclear Instruments and methods in Physics Research 225, 500–504 (1984). This leads to a substantial reduction in yield.

The Bridgman method has also been proposed for growing BGO crystals, as appears from the above-mentioned publication by E. Lorenz. According to this method the starting mixture is melted in a crucible and, in contact with a seed crystal, is moved in a furnace with a temperature gradient, in such a way that the crystal grows from the seed crystal. The advantage of this method is that by selecting a certain shape for the crucible, the crystal can be given any required shape, which is not possible with the Czochralski method.

However, the Bridgman method, just like the Czochralski method is found to give rise to significant crystal defects in the form of inclusions. Examples of these inclusions are: $GeO_2$, $Bi_2Ge_3O_9$, $Bi_{12}GeO_{20}$ or $Bi_2GeO_5$.

Surprisingly it has been found, according to the invention, that if the stoichiometry of the starting mixture of $Bi_2O_3$ and $GeO_2$ is changed in favour of $Bi_2O_3$, this results in a type of crystal which has such a low concentration of inclusions, that by ignoring a small zone of inclusions developed in the beginning of the growth process, this crystal is fully acceptable for practical use. Moreover, a high degree of crystal perfection is obtained. If bismuth germanate crystals have fewer dislocations and other imperfections, this also reduces the likelihood of damage upon exposure of radiation. The method of manufacturing bismuth germanate ($Bi_4Ge_3O_{12}$) crystals, in which the starting mixture is melted in a crucible and, the resulting melt being in contact with a seed crystal, is moved relatively with respect to a furnace with a temperature gradient down in the direction of said temperature-gradient with such a velocity that the crystal grows from the seed crystal, is characterized according to the invention in that the starting mixture has a composition of between 40.2 and 40.5 mol.% of $Bi_2O_3$ and between 59.8 and 59.5 mol.% of $GeO_2$.

Experiments have demonstrated that starting mixtures containing 39.4, -39.7, -39.75, and 40.0 mol.% of $Bi_2O_3$ give rise to impermissible inclusions in the entire crystal. With mixtures containing 40.6 mol.% and higher, the portion which is free of inclusions gradually decreases.

Starting mixture containing 40.2 and 40.5 mol.% of $Bi_2O_3$ result in perfect crystals.

The invention will be illustrated by a specific example.

In an ampoule-shaped platinum crucible, illustrated in the annexed drawing and having an internal diameter of the broadest part of 20 mm, an internal diameter of the smallest part, the stem of 4 mm a length of about 12 mm and a wall-thickness of 0.2 mm, the conical part having an angle of 70°±0.15' a mixture of powdered $Bi_2O_3$ and $GeO_2$ in a ratio of 40.5 mol.% of $Bi_2O_3$ and 59.5 mol.% of $GeO_2$ in the form of a tablet compressed without a binder is placed. The tablets have a diameter, nearly fitting in the broadest part of the crucible. The stem of the crucible is filled with seed crystals having a diameter of 4 mm and having a crystal orientation of [110] coinciding with the axis of the stem. The seed crystal has the stoichiometric composition of BGO ($Bi_4Ge_3O_{12}$).

The crucible is placed in a resistance heated furnace having an internal diameter of 45 mm and a total length of 75 cm, the resistance-element consisting of a number of sections, enabling the establishment of a temperature gradient. The furnace has a zone of 30 cm in which a temperature of 1070° C. is maintained at the top, a zone of 6 cm having a temperature-gradient of 10° C./cm and a zone of again 30 cm, at the lower part, in which a temperature of 1010° C. is kept constant.

The crucible is first placed in the 1070° C.-zone in a stationary position and kept therein until the mixture of oxides is molten and homogenized. When the equilibrium is attained, this being observed visually, the crucible is moved through the temperature gradient with a velocity of 1.1 mm/hour. During the whole growing process the furnace is rinsed through with pure oxygen. At the bottom of the zone of 1010° C. the crucible is cooled down to ambient-temperature at a rate of 20° C./h in the furnace in the switched-off position. The platinum crucible is peeled off from the cooled crystal, the conical part containing inlusions, is sawn off. A perfect crystal is obtained having a length of 8 cm and a diameter of 20 mm.

What is claimed is:

1. A method of manufacturing bismuth germanate ($Bi_4Ge_3O_{12}$) crystals, in which a starting mixture is melted in a crucible and the resulting melt being in contact with a seed crystal is moved relatively with respect to a furnace with a temperature gradient down in the direction of said temperature-gradient with such a velocity that the crystal grows from the seed crystal, characterized in that the starting mixture contains between 40.2 and 40.5 mol.% of $Bi_2O_3$ and between 59.8 and 59.5 mol.% of $GeO_2$.

* * * * *